(12) United States Patent
Putman et al.

(10) Patent No.: US 9,561,566 B2
(45) Date of Patent: Feb. 7, 2017

(54) CONTINUOUSLY SCANNING XY TRANSLATION STAGE

(75) Inventors: Matthew C. Putman, Brooklyn, NY (US); John B. Putman, Celebration, FL (US)

(73) Assignee: Nanotronics Imaging, Inc., Cuyahoga Falls, OH (US)

( * ) Notice: Subject to any disclaimer, the term of this patent is extended or adjusted under 35 U.S.C. 154(b) by 484 days.

(21) Appl. No.: 13/985,386

(22) PCT Filed: Feb. 15, 2011

(86) PCT No.: PCT/US2011/024849
§ 371 (c)(1),
(2), (4) Date: Oct. 16, 2013

(87) PCT Pub. No.: WO2012/112138
PCT Pub. Date: Aug. 23, 2012

(65) Prior Publication Data
US 2014/0027967 A1    Jan. 30, 2014

(51) Int. Cl.
*B23Q 1/48* (2006.01)
*B23Q 1/62* (2006.01)
*H01L 21/68* (2006.01)
*G03F 7/20* (2006.01)

(52) U.S. Cl.
CPC ............... *B23Q 1/48* (2013.01); *B23Q 1/4828* (2013.01); *B23Q 1/621* (2013.01); *G03F 7/70716* (2013.01); *H01L 21/68* (2013.01)

(58) Field of Classification Search
CPC ......... B23Q 1/48; B23Q 1/4828; B23Q 1/621; B23Q 3/00; B23Q 17/22; B23Q 5/34; G03F 7/70775; G03F 7/70716
See application file for complete search history.

(56) References Cited

U.S. PATENT DOCUMENTS

| | | | | |
|---|---|---|---|---|
| 3,404,459 A | * | 10/1968 | Redman | B23Q 1/4804 266/70 |
| 3,638,508 A | * | 2/1972 | Ikeda | F16H 27/045 74/426 |
| 3,801,090 A | * | 4/1974 | Gillen | B23Q 1/621 248/913 |
| 5,142,791 A | | 9/1992 | Kobayashi et al. | |

(Continued)

FOREIGN PATENT DOCUMENTS

| | | |
|---|---|---|
| JP | 284001/90 | 11/1990 |
| JP | 51962/95 | 2/1995 |
| WO | 03/039808 A1 | 5/2003 |

*Primary Examiner* — Monica Carter
*Assistant Examiner* — Seahee Yoon
(74) *Attorney, Agent, or Firm* — Renner Kenner Greive Bobak Taylor & Weber

(57) ABSTRACT

An XY translation stage includes a primary drive mechanism and a stage drive assembly. The primary drive mechanism rotates the stage drive assembly about an axis of rotation. The XY translation stage also includes an object stage that orbits freely in a defined plane without rotation of the object stage out of that defined plane. A stage pin associates the stage drive assembly with the object stage such that rotational movement of the stage drive assembly yields orbital movement of the object stage within the defined plane. The positioning of the stage pin relative to the axis of rotation is adjustable such that the diameter of the orbital movement of the object stage is adjustable.

5 Claims, 17 Drawing Sheets

(56) References Cited

U.S. PATENT DOCUMENTS

| | | | | |
|---|---|---|---|---|
| 5,279,178 A | * | 1/1994 | Yanagisawa | B23Q 1/267 108/143 |
| 5,408,750 A | | 4/1995 | Teng et al. | |
| 5,419,410 A | * | 5/1995 | Yanagisawa | B65G 47/901 186/49 |
| 5,481,936 A | * | 1/1996 | Yanagisawa | B23Q 1/52 108/139 |
| 5,499,552 A | * | 3/1996 | Yanagisawa | B23Q 1/621 184/15.1 |
| 5,595,464 A | * | 1/1997 | Daniels, Jr. | B23Q 5/54 409/159 |
| 6,313,945 B1 | * | 11/2001 | Takeuchi | G02B 21/26 359/368 |
| 6,327,979 B1 | * | 12/2001 | Ochi | A63G 7/00 104/53 |
| 6,809,306 B2 | | 10/2004 | Ando et al. | |
| 8,087,320 B2 | * | 1/2012 | Hsieh | F16H 25/14 74/490.07 |
| 2009/0067976 A1 | * | 3/2009 | Xu | H01L 21/68 414/757 |
| 2011/0070812 A1 | * | 3/2011 | Hsieh | B24B 19/226 451/259 |
| 2011/0259139 A1 | * | 10/2011 | Wang | H01L 21/68 74/490.09 |

\* cited by examiner

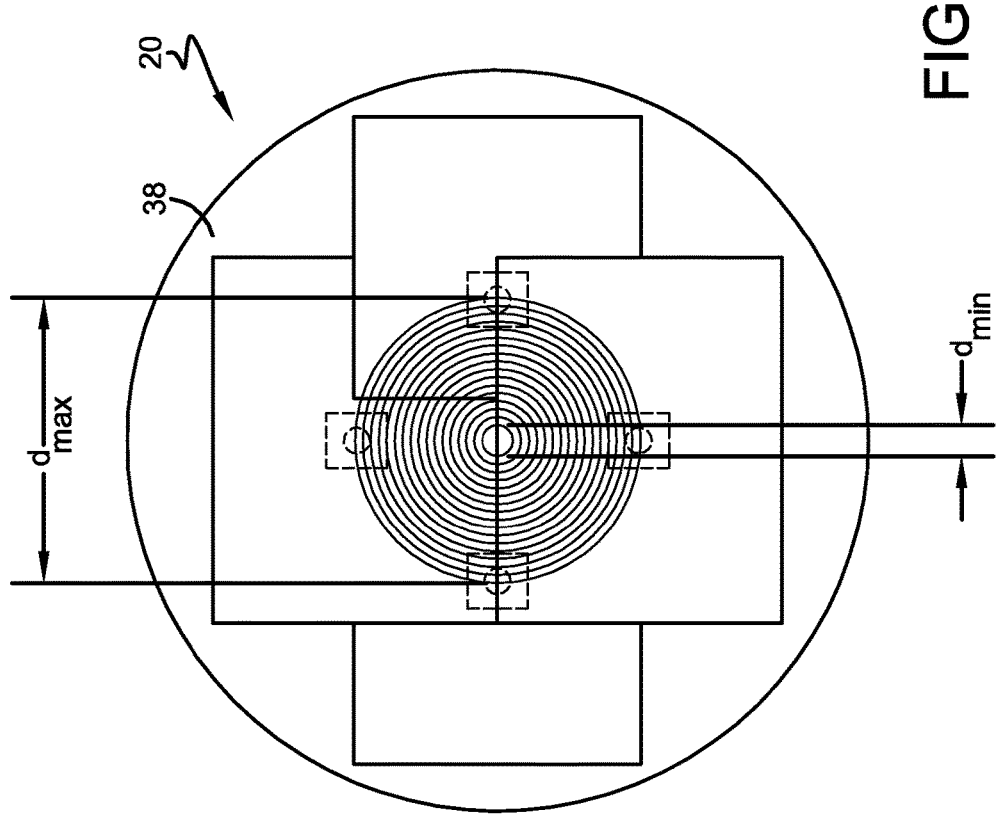

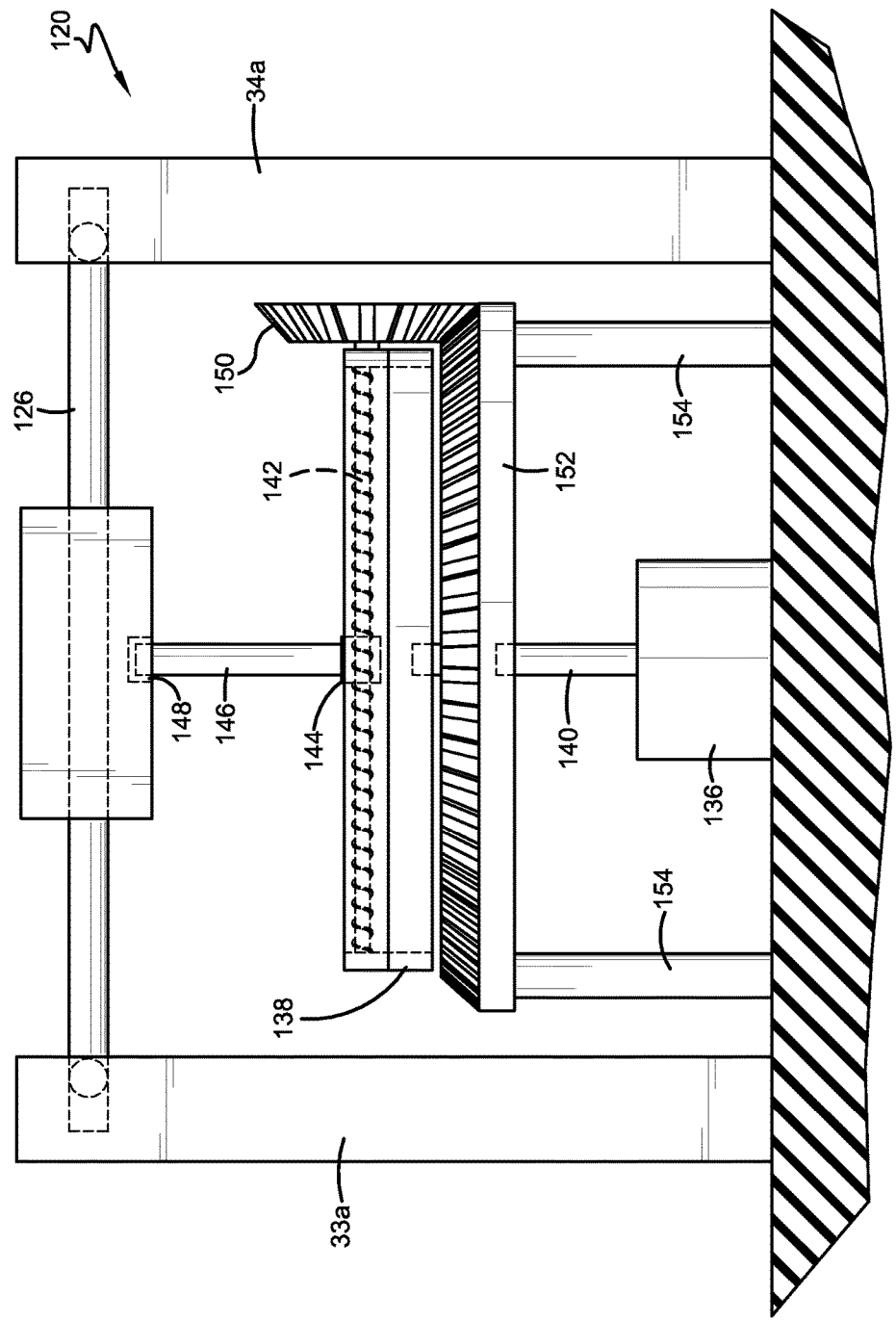

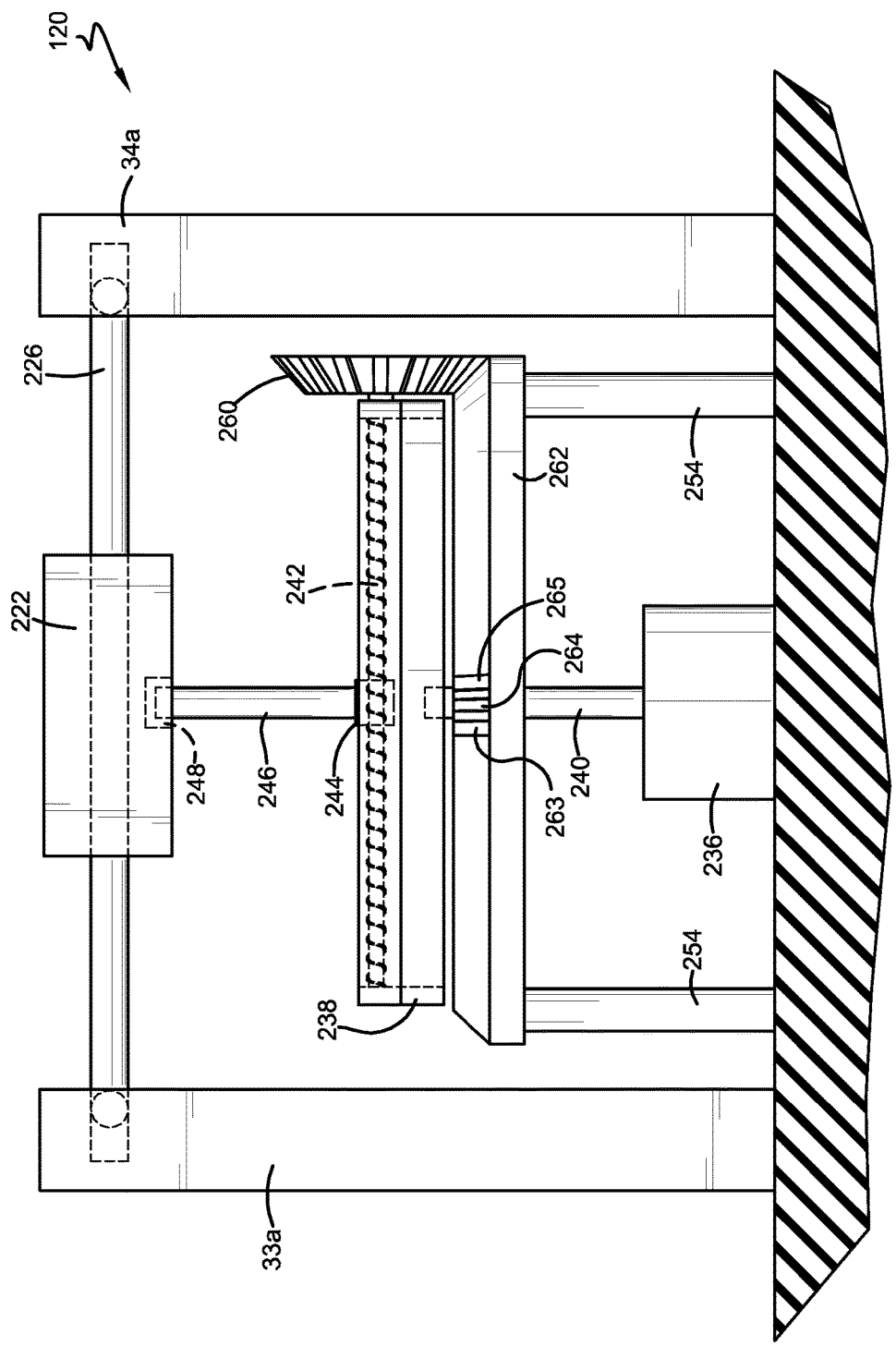

CONTINUOUSLY SCANNING XY TRANSLATION STAGE

CROSS-REFERENCE TO RELATED APPLICATION

This application claims priority from International Application No. PCT/US2011/024849 filed on Feb. 15, 2011, the contents of which are incorporated herein by reference.

FIELD OF THE INVENTION

The present invention generally relates to the art of motion control, and, more particularly to apparatus for moving an object in a plane. In particular embodiments, the present invention relates to apparatus for moving an object in a plane in a continuous spiral pattern, and in another embodiment, in concentric circles. In a specific, though non-limiting application, the present invention relates to apparatus for moving an object in a plane relative to an imaging device.

BACKGROUND OF THE INVENTION

Apparatus currently exist for moving an object in a defined plane. These apparatus utilize manual or motorized systems to move the object in one defined direction within the plane, for example, the x direction, and use a second manual or motorized system to move the object in a direction within the plane that is perpendicular to the first, for example, in the y direction. The use of the exemplary "x direction" and "y direction" terms, of course describes movement in an XY plane. It should be appreciated that such terms can be used to define any plane, inasmuch as a plane is a two-dimensional surface, with one dimension being denoted as "x" and the other being denoted as "y". Such terms are employed in the present disclosure.

The aforementioned apparatus is referred to as an "XY translation stage," and many configurations are known to those familiar in the art. Typical suppliers include Franklin Mechanical and Control Inc. (Gilroy, Calif., USA) and Physik Instrumente L.P. (Auburn, Mass., USA, also known by PI L.P.). From a review of the translation stages provided by these entities as well as those specifically in U.S. Pat. No. 5,142,791 (Hitachi, Ltd., Tokyo, Japan), U.S. Pat. No. 5,408,750 (Mitutoyo Corporation, Tokyo, Japan), and U.S. Pat. No. 6,809,306 (Olympus Optical Co. Ltd., Tokyo, Japan), it can be seen that the means for managing the movement and tolerances of the movement are varied. It can also be seen that the movement may be manual, or motorized, including but not limited to servo, stepper and piezo-electric motor movement.

An example of the prior art is provided in FIGS. 1A, 1B and 1C, which illustrate a typical XY translation stage. In FIG. 1A an X stage 1 is shown to move a platform 7 in the X plane. A primary drive mechanism 6, which may be either manual or motorized, is connected to a lead screw 3 by a connector 5. The lead screw 3 is bearing mounted to mounting brackets 2a and 2b, which are generally affixed to a stationary surface. A guide rod 4 is also mounted to the mounting brackets 2a and 2b, and the platform 7 includes a through bore 8 through which the guide rod 4 extends so that the platform 7 can move along the guide rod 4. The platform 7 also either includes a threaded bore 9 or is equipped with a ball nut so that, as the lead screw 3 is rotated by the primary drive mechanism 6, the platform 7 is moved through the plane in the X direction. Guide rod 4 prevents rotation of platform 7.

In FIG. 1B a Y stage 10 is shown to move platform 16 in the Y plane. A primary drive mechanism 15, which may be either manual or motorized, is connected to a lead screw 12 by connector 14. The lead screw 12 is bearing mounted to mounting brackets 11a and 11b, which as will be described more fully below with respect to FIG. 1C are affixed to the platform 7. A guide rod 13 is also mounted to the mounting brackets 11a and 11b, and the platform 16 includes a through bore 18 through which the guide rod 13 extends so that the platform 16 can move along the guide rod 13. The platform 16 also either includes a threaded bore 19 or is equipped with a ball nut so that, as the lead screw 12 is rotated by the primary drive mechanism 15, the platform 16 is moved through the plane in the Y direction. Guide rod 13 prevents rotation of platform 16.

In FIG. 1C the platform 16 of Y stage 10 is affixed to the platform 7 of X stage 1 by affixing mounting brackets 11a and 11b to the platform 7. The combined stages in FIG. 1C represent a typical XY translation stage 17 where the object to be moved is placed upon platform 16 and, thus mounted, can be freely moved in the Y direction through rotation of the lead screw 12 and in the X direction through rotation of the lead screw 3. Hence, platform 16 and the object thereupon are capable of being moved freely in the X and Y directions being constrained only by the length of the respective lead screws 3 and 12.

In the current art as shown in FIG. 1C (and in known variations thereof), it can be seen that the degree of movement is constrained by the pitch of the lead screws 3 and 12 and rotational control of the primary drive mechanisms 6 and 15. For example, given a lead screw 3 with a pitch of 5 threads per millimeter and a stepper motor capable of stepping at 1 degree of rotation per step driving the lead screw 3, each step of the stepper motor will move the platform approximately 0.56 micrometers. Thus, the degree of incremental movement may be changed by the selection of the drive and lead screw.

As known, such translation stages are often employed for scanning an object. As used herein, "scanning" is to be understood broadly to refer to defining or analyzing a desired surface area of an object, whether by probe, stylus or electromagnetic beam (e.g., visible light, electron beam, laser, etc). For example, these translation stages are often employed in scanning probe microscopy, scanning beam microscopy, and optical inspection devices and the like. With the aforementioned XY translation stages, in order to scan an entire defined XY plane, the direction of travel must be stopped and reversed when the platform has reach the limit of travel defined by the length of the lead screw. Hence, movement is stopped and direction changed many times during a scan. With the components given in this example, movement would have to be stopped and direction changed approximately 180,000 times to scan a 100×100 mm plane, and the starting, stopping, speed and direction of translational movement must be controlled either by manual operator intervention or by a method of computer motor control of two primary drive mechanisms, one for the X stage and one for the Y stage.

Though the art is populated with various translation stages, there exists room for improvement thereon by providing apparatus for more easily automated translational movement. The present invention is designed to reduce both the motion management and XY translation stage complexity.

SUMMARY OF THE INVENTION

In one embodiment, this invention provides an XY translation stage comprising a primary drive mechanism and a stage drive assembly. The primary drive mechanism rotates the stage drive assembly about an axis of rotation. The XY translation stage also includes an object stage that orbits freely in a defined plane without rotation of the object stage out of that defined plane. A stage pin associates the stage drive assembly with the object stage such that rotational movement of the stage drive assembly yields orbital movement of the object stage within the defined plane. The positioning of the stage pin relative to the axis of rotation is adjustable such that the diameter of the orbital movement of the object stage is adjustable.

In another embodiment, this invention provides an XY translation stage comprising a primary drive mechanism and a stage drive assembly. The primary drive mechanism rotates the stage drive assembly about an axis of rotation. The translation stage further includes an object stage and means for retaining the object stage in a defined plane without rotation of the object stage out of the plane. A stage pin associates the stage drive assembly with the object stage, and means are provided for adjusting the position of the stage pin relative to the axis of rotation of the stage drive assembly such that rotational movement of the stage drive assembly yields orbital movement of the object stage within the defined plane.

In particular embodiments in accordance with either of the XY translation stages summarized above, the translation stage further includes a lead screw associated with the stage drive assembly to rotate therewith, the stage pin being threaded onto the lead screw such that rotation of the lead screw causes the stage pin to move along the length of the lead screw to occupy different positions relative to the axis of rotation of the stage drive assembly. In further adaptations of these embodiments, the translation stage further includes a lead screw bevel gear associated with the lead screw and a drive bevel gear that mates with the lead screw bevel gear, the interaction of the lead screw bevel gear and the drive bevel gear serving to rotate the lead screw and thereby cause the stage pin to move along the length of the lead screw. In specific embodiments, the drive bevel gear is stationary and includes a discrete set of bevel gear cogs, the lead screw bevel gear interacting with the drive bevel gear, through the discrete set of bevel gear cogs, once during a single rotation of the stage drive assembly and the stage pin moves a discrete distance due to that interaction. In other specific embodiments, the drive bevel gear provides a complete ring of bevel gear cogs such that the lead screw bevel gear interacts with the drive bevel gear, through the bevel gear cogs, at all times during rotation of the stage drive assembly and the stage pin moves continuously along the length of the lead screw due to that interaction.

BRIEF DESCRIPTION OF THE DRAWINGS

For a complete understand of the objects, techniques and structure of the invention, reference should be made to the following detailed description and accompanying drawing wherein:

FIG. 11 is a general schematic top view of the XY translation stage of FIG. 2 illustrating the potential for moving the object stage in concentric circular paths;

FIG. 12A is a side elevation view of a second embodiment of an XY translation stage in accordance with this invention, wherein the translation stage can produce a spiral stage movement pattern;

FIG. 13A is a side elevation view of a third embodiment of an XY translation stage in accordance with this invention, wherein the translation stage can produce a concentric circle movement pattern.

DETAILED DESCRIPTION OF ILLUSTRATIVE EMBODIMENTS

Figure 1A:
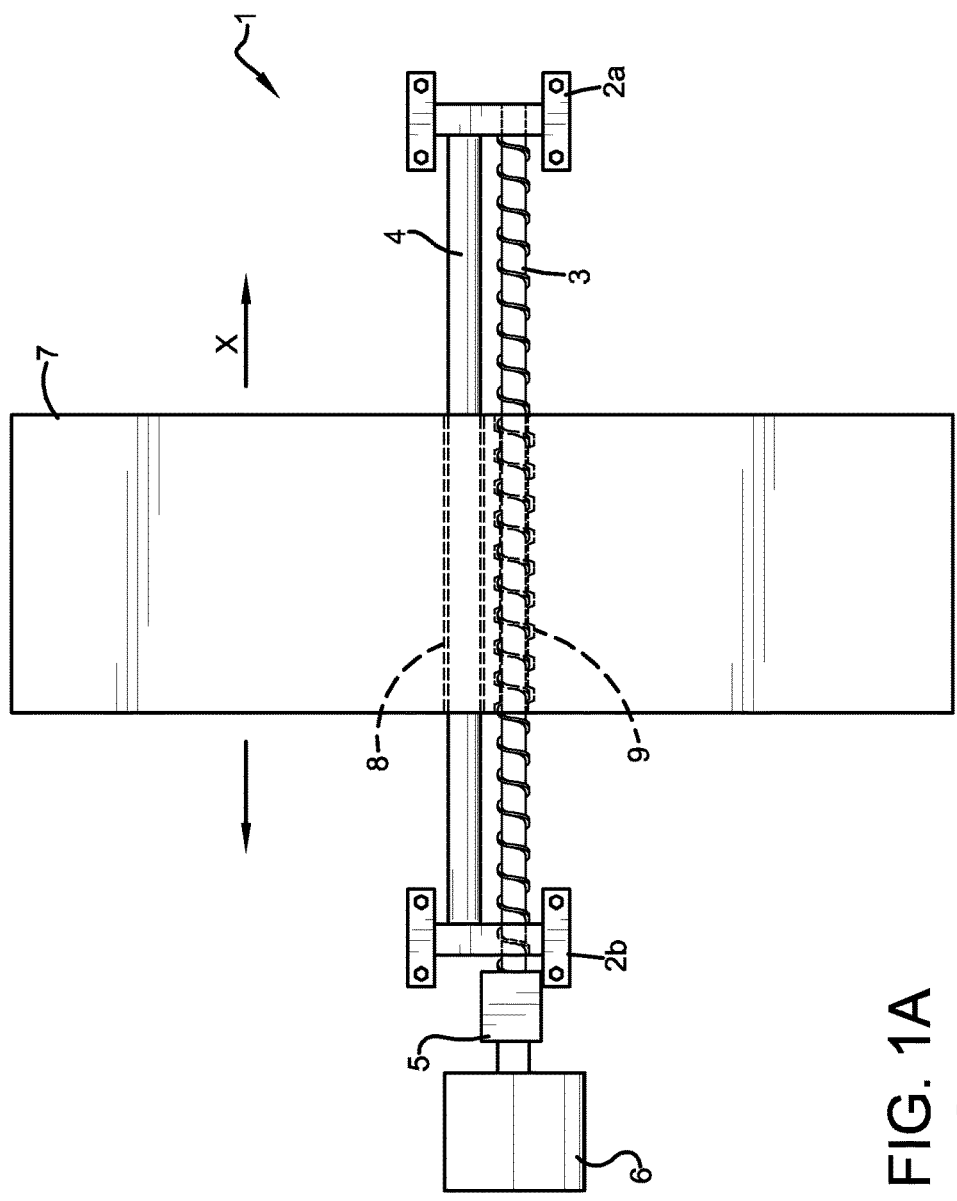
FIGS. 1A, 1B and 1C generally represent an XY translation stage according to prior art.
Figure 1B:
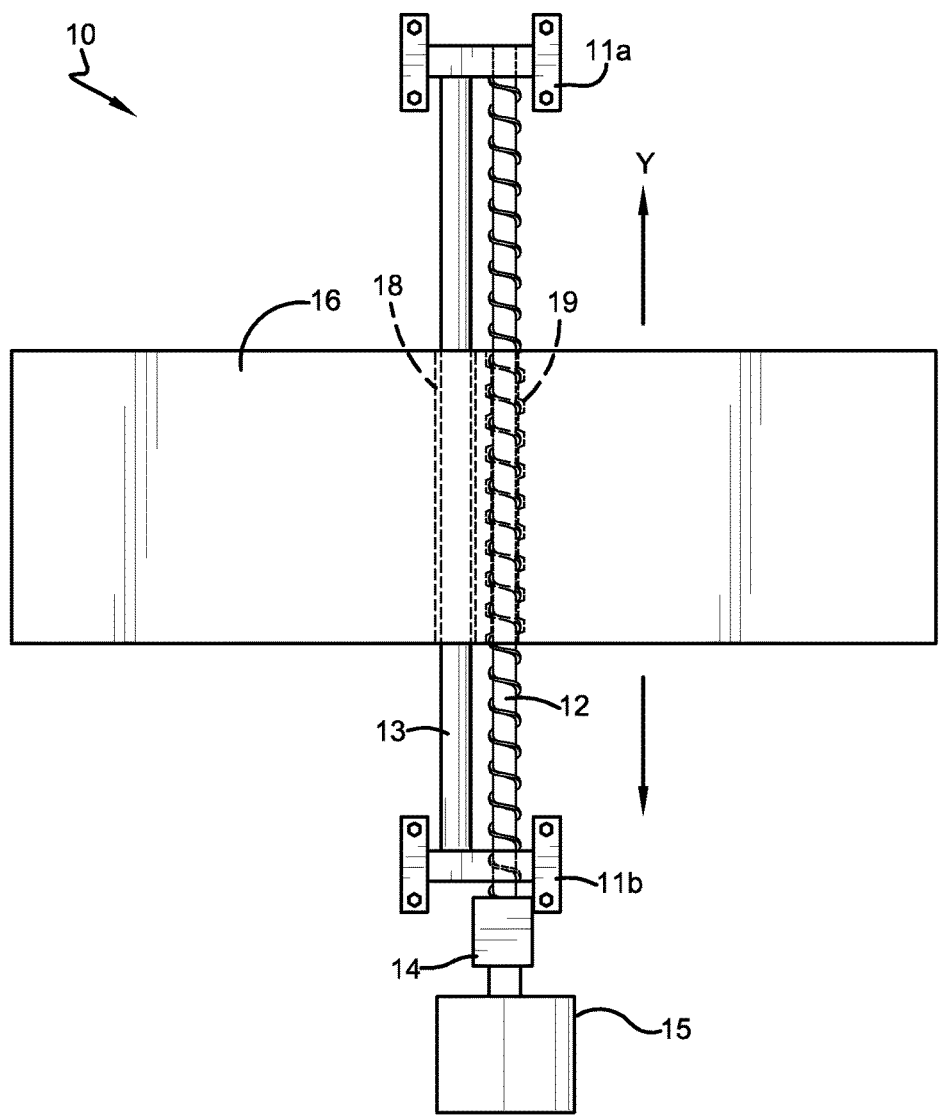
Figure 1C:
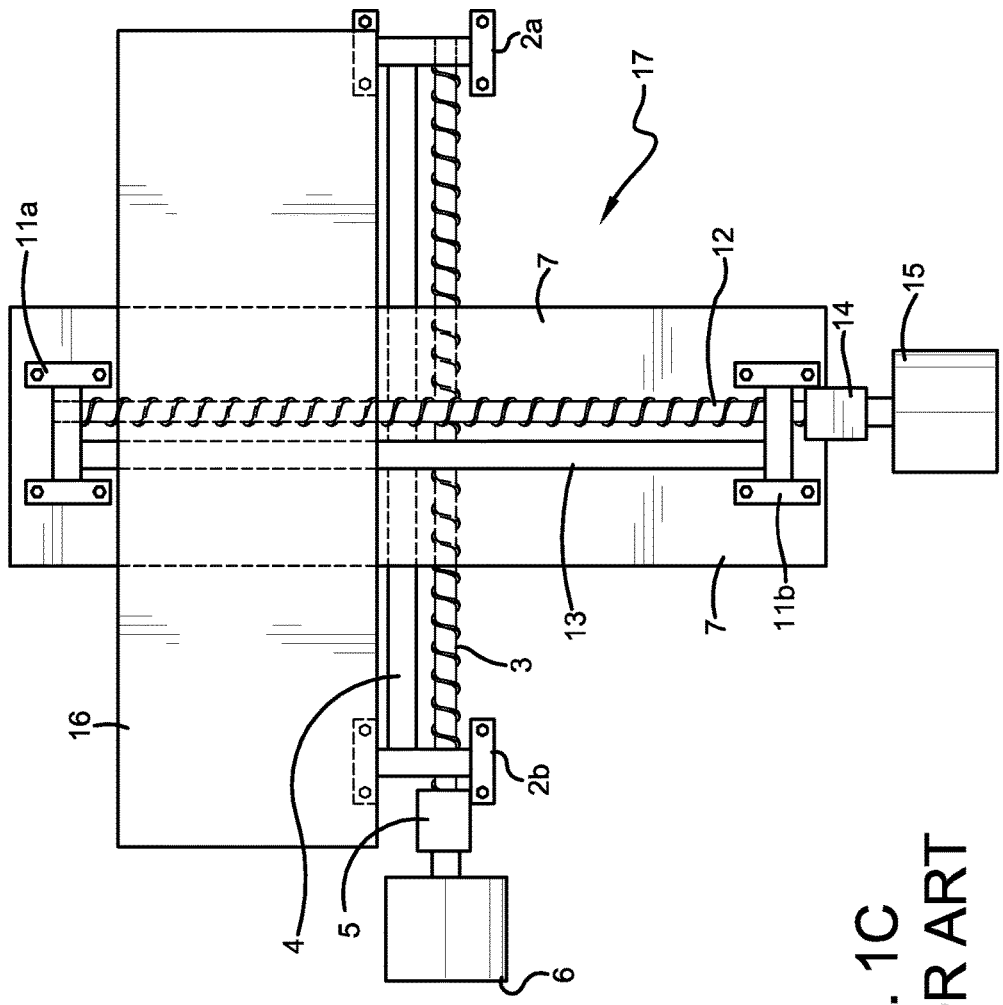
Figure 2:
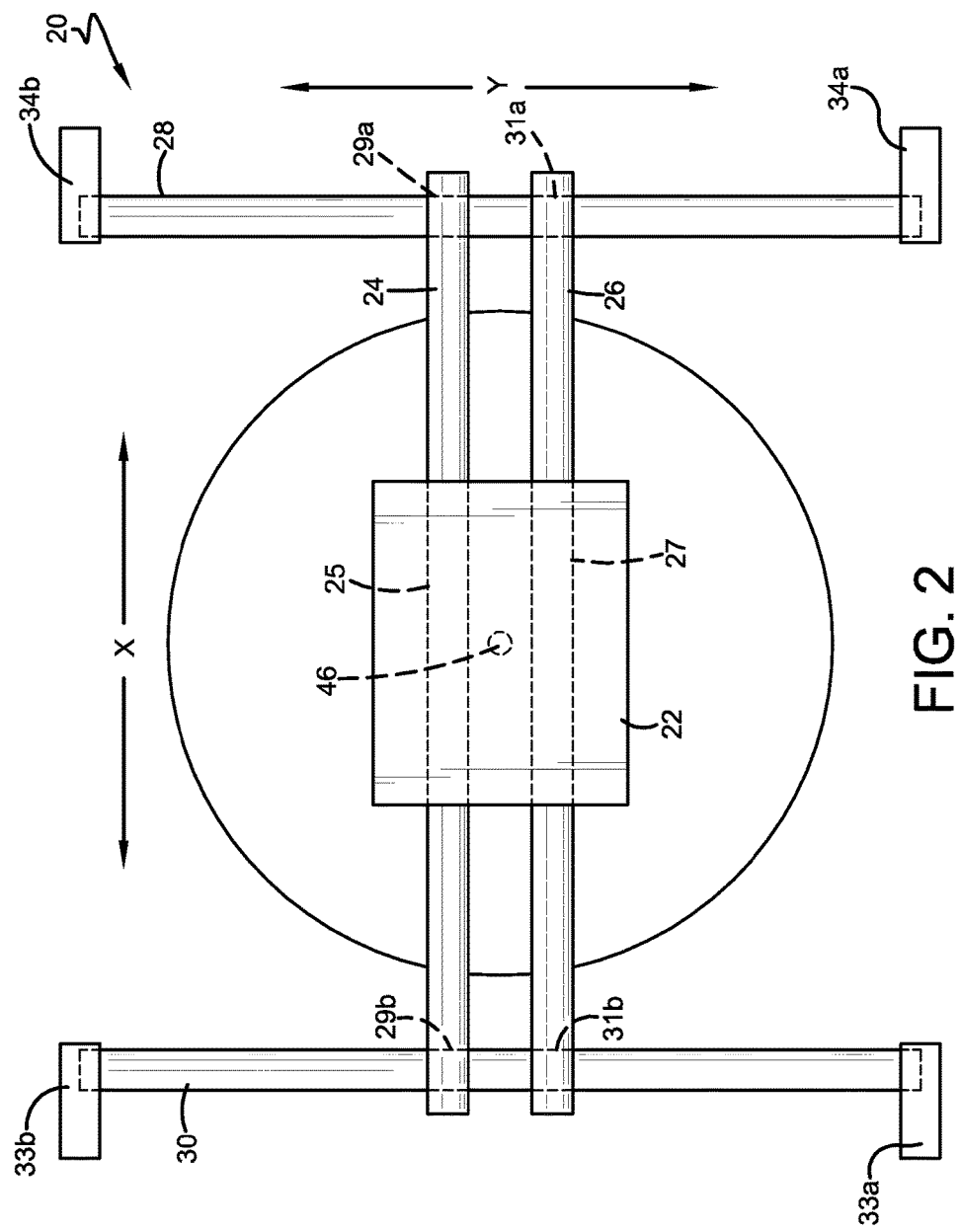
FIG. 2 is a top plan view of an XY translation stage according to the present invention, shown with the object stage in a center position on the stage drive assembly.

A first embodiment of an XY translation stage in accordance with this invention is shown in FIGS. 2-11 and designated by the numeral 20. The translation stage 20 includes an object stage 22 that is mounted to guide rods 24 and 26 at through bores 25 and 27 in the object stage 22. The guide rods 24 and 26 extend in the X direction shown in FIG. 2 such that the object stage 22 is capable of sliding thereon in the X direction. Opposed ends of the guide rods 24 and 26 are mounted to guide rods 28 and 30 at through bores 29a and 29b (in rod 24) and 31a and 31b (in rod 26). The guide rods 28 and 30 extend in the Y direction shown in FIG. 2 such that the guide rods 24 and 26 are capable of sliding thereon in the Y direction. Thus, the object stage 22 is capable of moving in both the X and Y directions. Linear bearings are established at the interaction of rod 24 and through bore 25 and at the interaction of rod 26 and through bore 27 to permit the object stage 22 to move along guide rods 24 and 26. Similarly, linear bearings are established at the interaction of rod 28 and through bores 29a (rod 24) and 31a (rod 26) and at the interaction of rod 30 and through bores 29b (rod 24) and 31b (rod 26) to permit guide rods 24 and 26 to move along guide rods 28 and 30. The translation stage 20 includes legs 33a, 33b, 34a and 34b that affixed the translation stage 20 to a surface. With such a structure, the object stage 22 is capable of moving in a single plane defined by X and Y directions, and thus termed the XY plane. By employing two guide rods 24 and 26 extending in a parallel relationship through the through bores 25 and 27 in the object stage 22, the object stage 22 is prevented from rotating and thus kept level during movement. Thus, the object stage 22 orbits freely in a defined plane without rotation of the object stage out of that plane. Other structures for ensuring such movement can be practiced, as, for example, by employing a non-circular through bore and non-circular guide rod.

Figure 3:
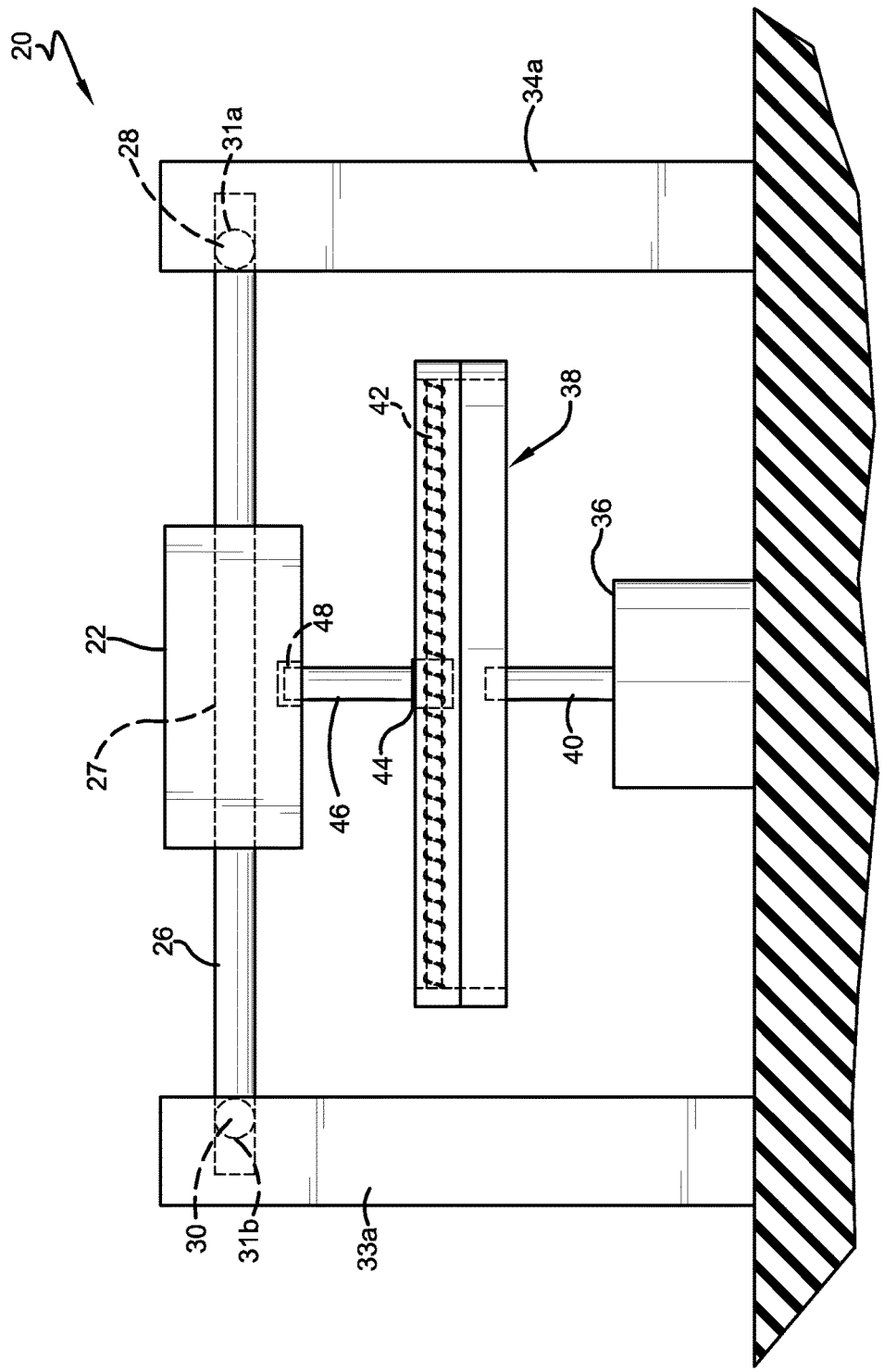
FIG. 3 is a side elevation view of the XY translation stage of FIG. 2.
Figure 4:
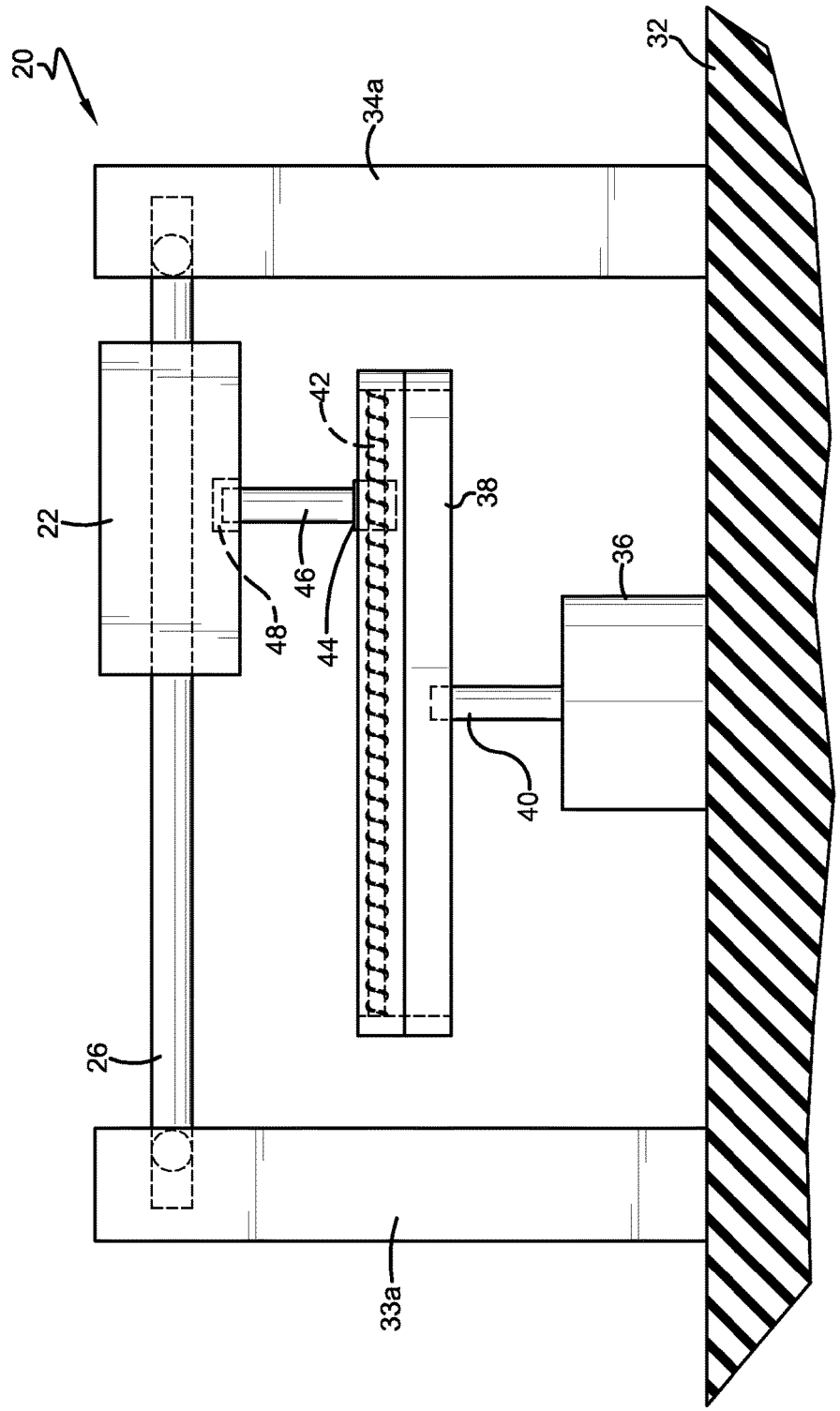
FIG. 4 is a side elevation views of the XY translation stage of FIG. 2, shown with the object stage moved to an offset position on the stage drive assembly.
Figure 5:
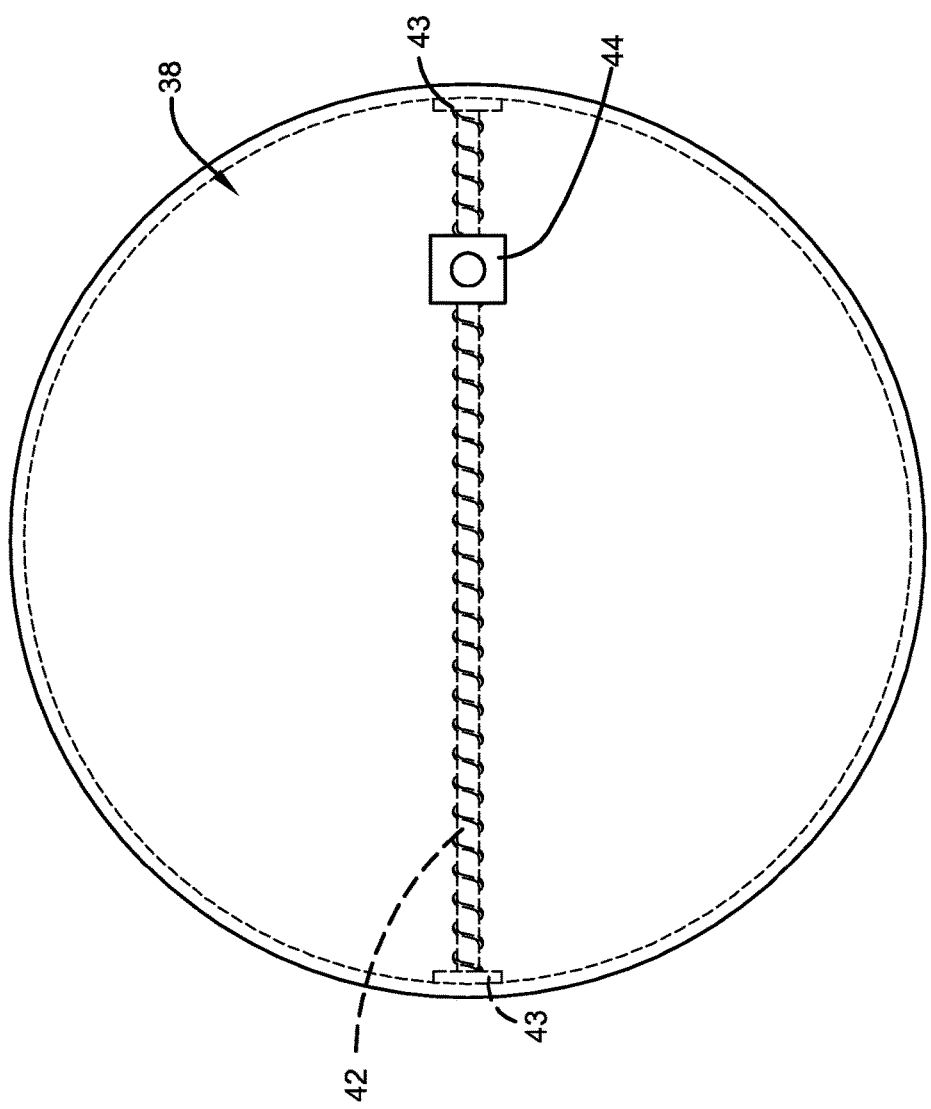
FIG. 5 is a top plan view of the stage drive assembly and components thereof.
Figure 6:
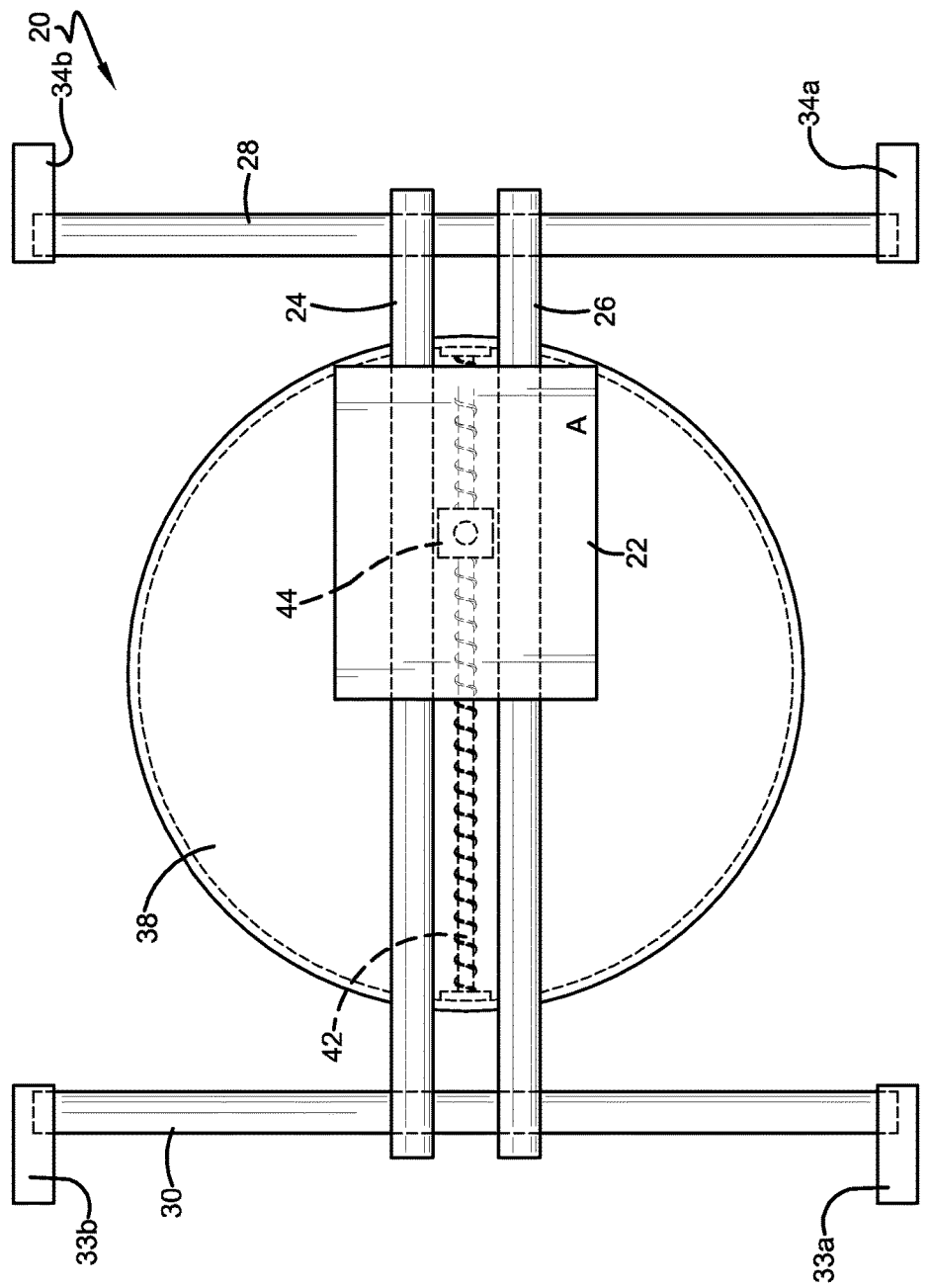
FIG. 6 is a top plan view of the XY translation stage of FIG. 2, shown with the object stage moved to an offset position on the stage drive assembly and with the stage drive assembly positioned at 0 degrees rotation.
Figure 7:
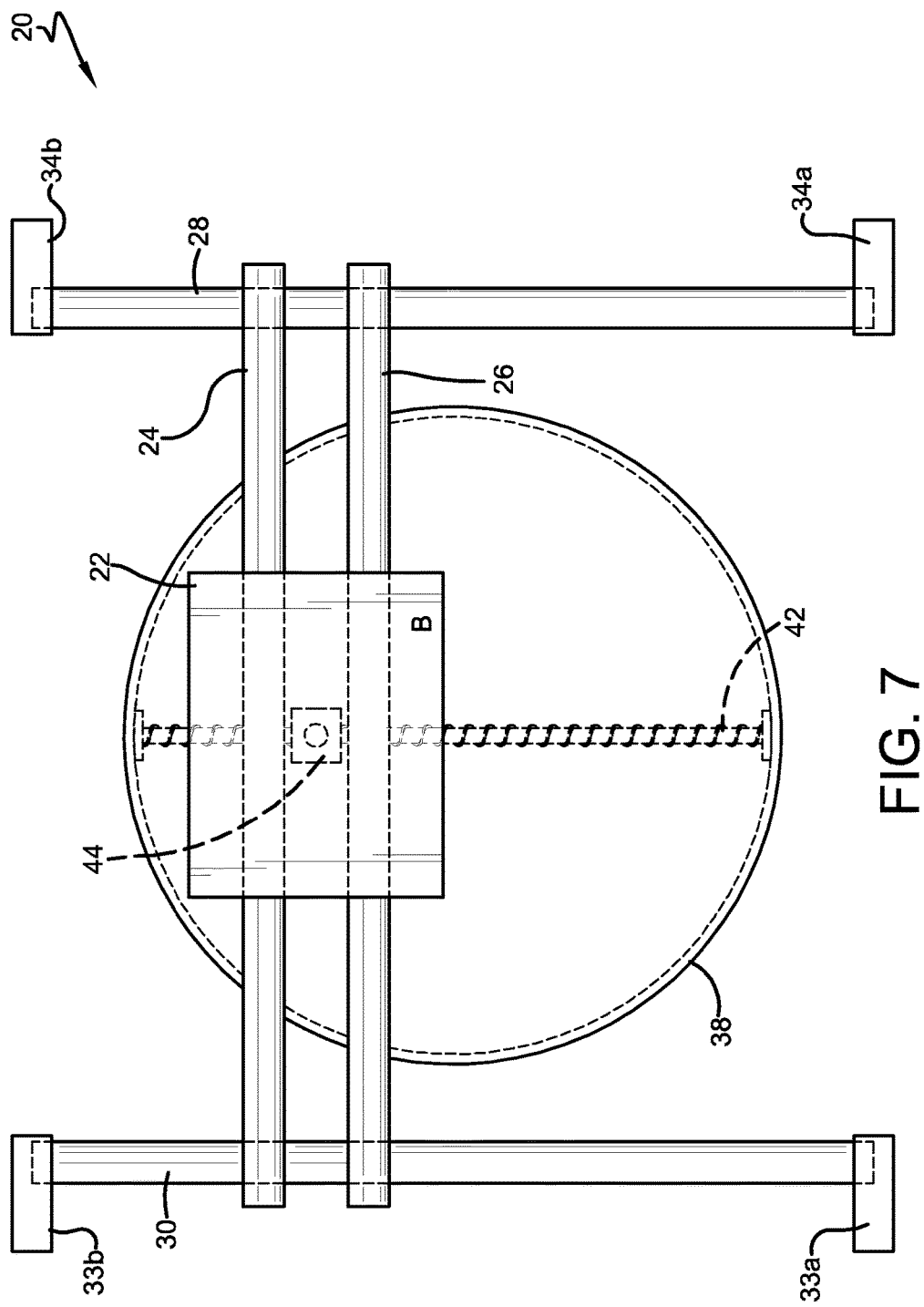
FIG. 7 is a top plan view of the XY translation stage of FIG. 2, shown with the object stage moved to an offset position on the stage drive assembly and with the stage drive assembly positioned at 90 degrees rotation.
Figure 8:
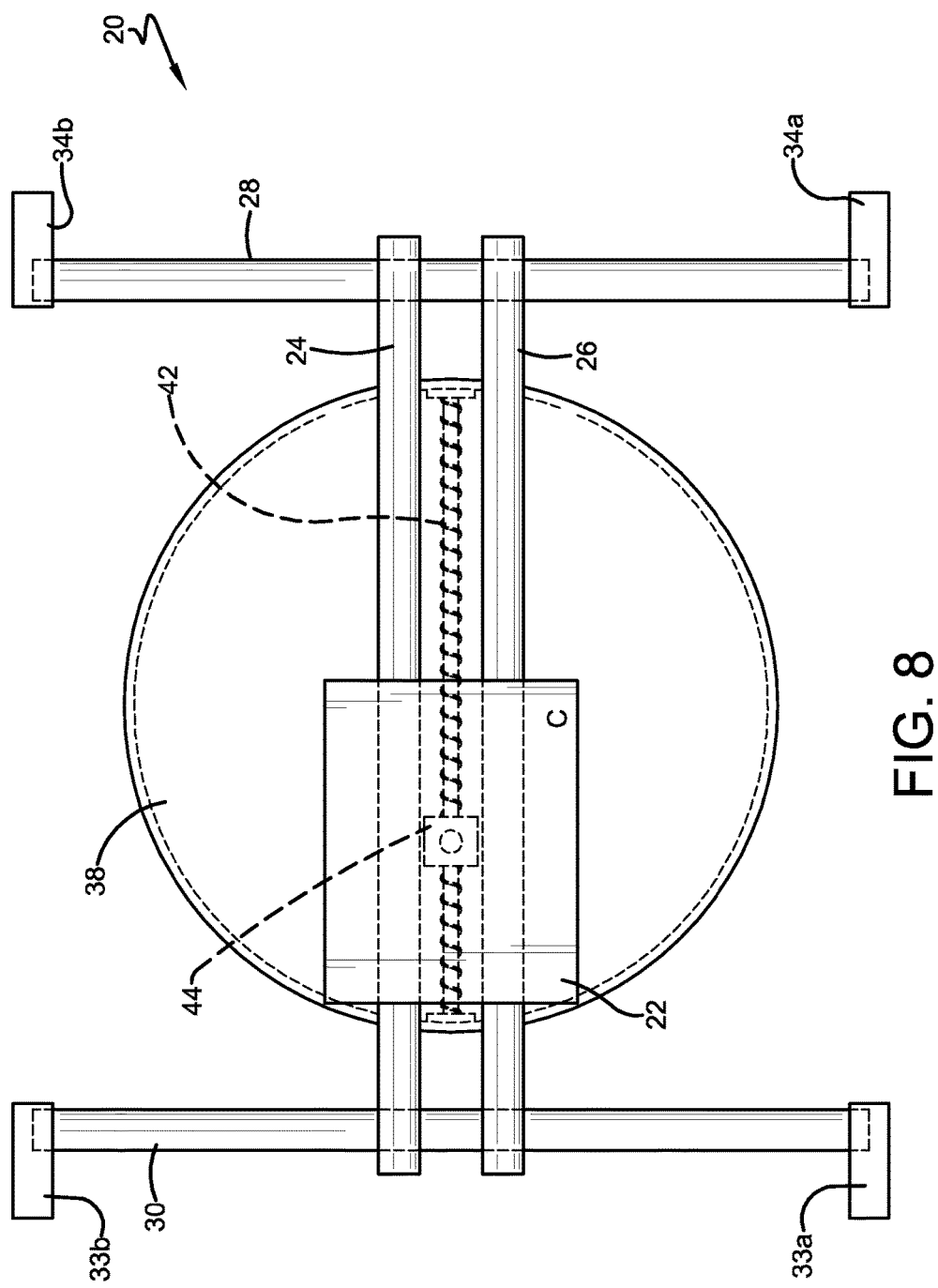
FIG. 8 is a top plan view of the XY translation stage of FIG. 2, shown with the object stage moved to an offset position on the stage drive assembly and with the stage drive assembly positioned at 180 degrees rotation.
Figure 9:
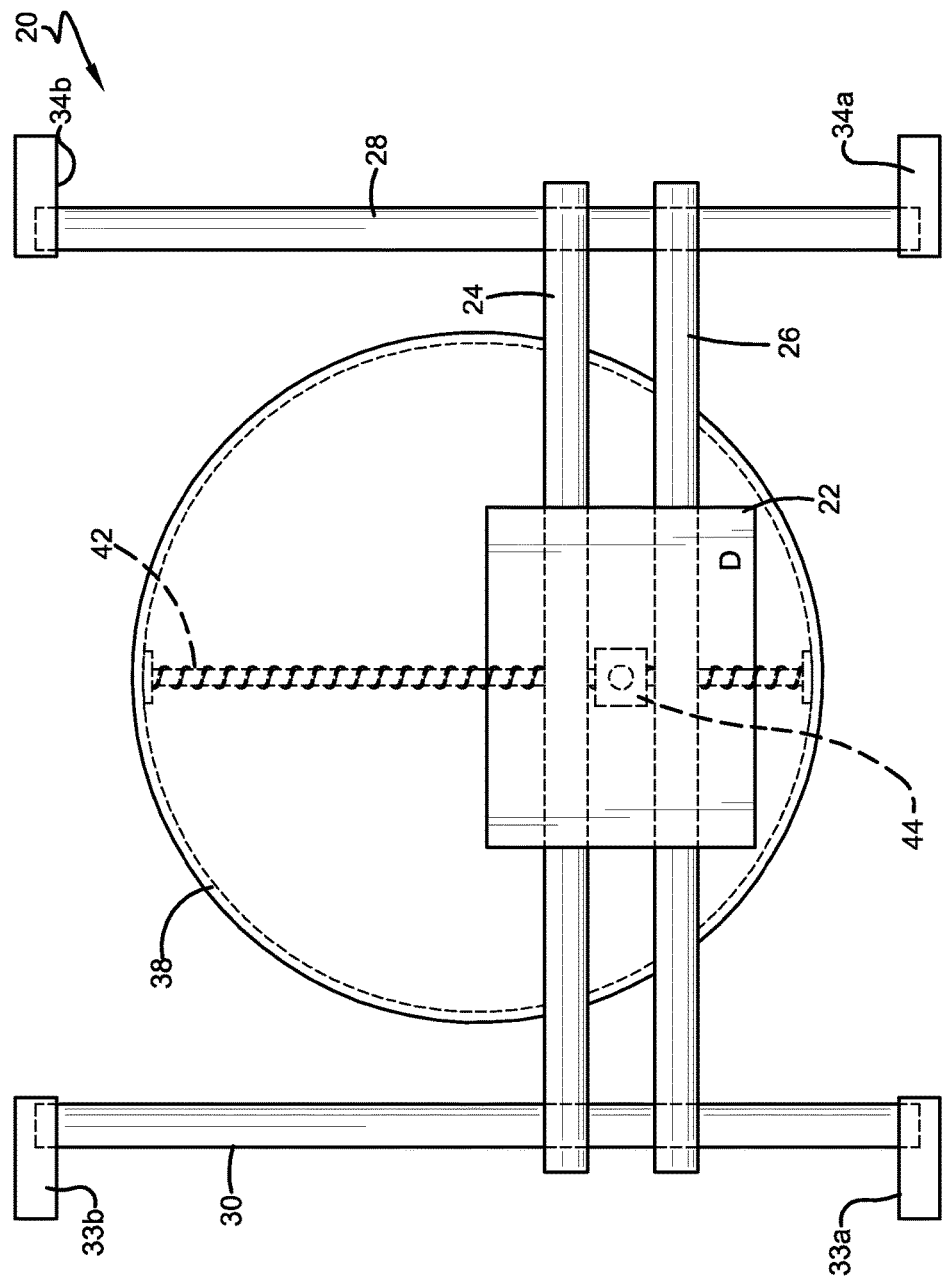
FIG. 9 is a top plan view of the XY translation stage of FIG. 2, shown with the object stage moved to an offset position on the stage drive assembly and with the stage drive assembly positioned at 270 degrees rotation.

As seen in FIGS. 3 and 4, a primary drive mechanism 36 serves to move the object stage 22 in the XY plane. The primary drive mechanism 36 is preferably a stepper motor but may be any motor or manual drive. The primary drive mechanism 36 is attached to a stage drive assembly 38 by a shaft 40 that is rotated by the primary drive mechanism 36 so that the stage drive assembly 38 is rotationally driven about the axis of rotation defined by the shaft 40. It should be appreciated that this is merely one way in which to rotationally drive the stage drive assembly 38, and other drive concepts can be employed. For example, the primary drive mechanism may instead include a motor that is off set from the stage drive assembly 38 and drives the same through a belt drive. Additionally, a coupling may be employed at the joining of the shaft 40 and the stage drive assembly 38 so that the shaft 40 and drive assembly 38 may be disengaged at will.

The stage drive assembly 38 consists of a lead screw 42 and a lead screw ball nut 44 which is threaded to move along the length of the lead screw 42 as the lead screw 42 is rotated, the lead screw ball nut 44 moving in one direction along the lead screw 42 when the lead screw 42 is rotated in one direction (e.g. clockwise) and moving in the opposite direction when the lead screw 42 is rotated in an opposite direction (e.g. counterclockwise). The opposed ends of the lead screw 42 are attached to the stage drive assembly 38 by bearings and bearing housings generally shown in FIG. 5 at numeral 43, and as known to those of ordinary skill in the art. A stage pin 46 extends from the ball nut 44 and engages the object stage 22 through a bearing 48 so that the stage pin 46 can rotate relative to the object stage 22. As the lead screw 42 is rotated, ball nut 44 and therefore stage pin 46 travels along the lead screw 42 to different axially offset locations relative to the center of the screw 42. In accordance with this invention, the lead screw 42 can be manipulated manually or through automated processes, though automated processes will likely be more preferred as they decrease operator time and effort and can be programmed to achieve desired movement. Because the stage pin 46 is coupled to the object stage 22 by a bearing 48, the object stage 22 moves accordingly with the stage pin 46. A representative movement of the stage pin 46 and the object stage 22 is shown in FIG. 4. A top view of the stage drive assembly 38 and its aforementioned components is provided in FIG. 5, where the lead screw 42 and ball nut 44 are clearly seen.

Figure 10:
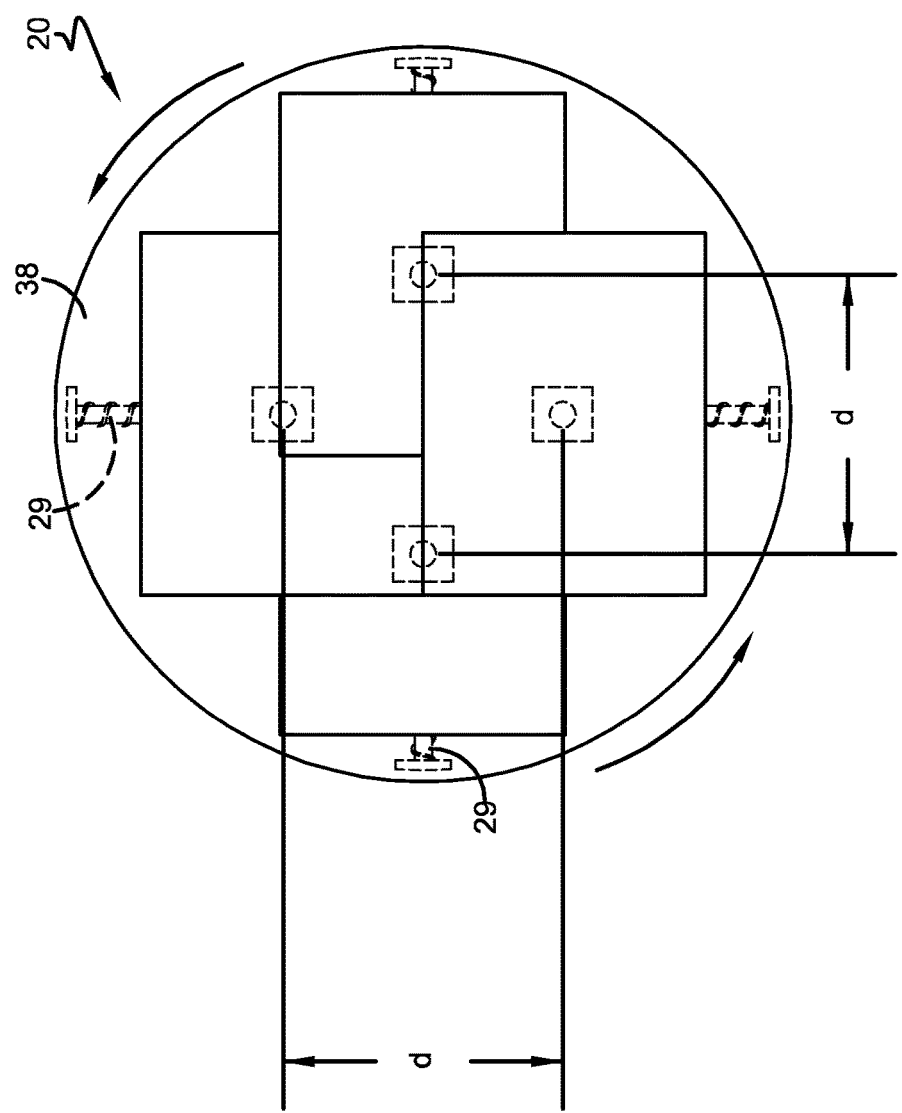
FIG. 10 is a general schematic top view of the XY translation stage of FIG. 2, showing how the object stage placements of FIGS. 6-9 overlap.

The stage pin 46 is associates the stage drive assembly 38 with the object stage 22 such that rotational movement of the stage drive assembly 38 yields orbital movement of the object stage, with the positioning of the stage pin relative to the axis of rotation of the stage drive assembly defining the diameter of the orbital movement. FIGS. 6, 7, 8 and 9 show the movement of the object stage 22 as the stage drive assembly 38 is rotated counterclockwise through 360 degrees. The different images provided are shown at 90 degree intervals, with the positioning at 0 degrees being labeled as A, the positioning at 90 degrees being labeled as B, the positioning at 180 degrees being labeled as C, and the positioning at 270 degrees being labeled as D. It is noted that the object stage 22 (and thus any object placed thereon) does not change orientation relative to the X and Y axis but does change position. This change in position is represented in FIG. 10, wherein the different positions A, B, C and D are shown superimposed. By comparing the positioning of the stage pin 46 in each position A, B, C and D, it can be seen that continuous rotation of the stage drive assembly 38 by the primary drive mechanism 36 would cause the stage pin 46 to rotate in a circle having a diameter d. It is shown in FIG. 11 that as the stage pin 46 is incrementally moved further away from the center of the lead screw 46, the stage pin 46 moves in concentric circles having diameters ranging from dmin to dmax. The diameter dmin would be dependent upon the minimum movement off of the center of the lead screw 42, and the diameter dmax would be dependent upon the acceptable outermost positioning of the ball nut 44 on the lead screw 42.

Figure 12B:
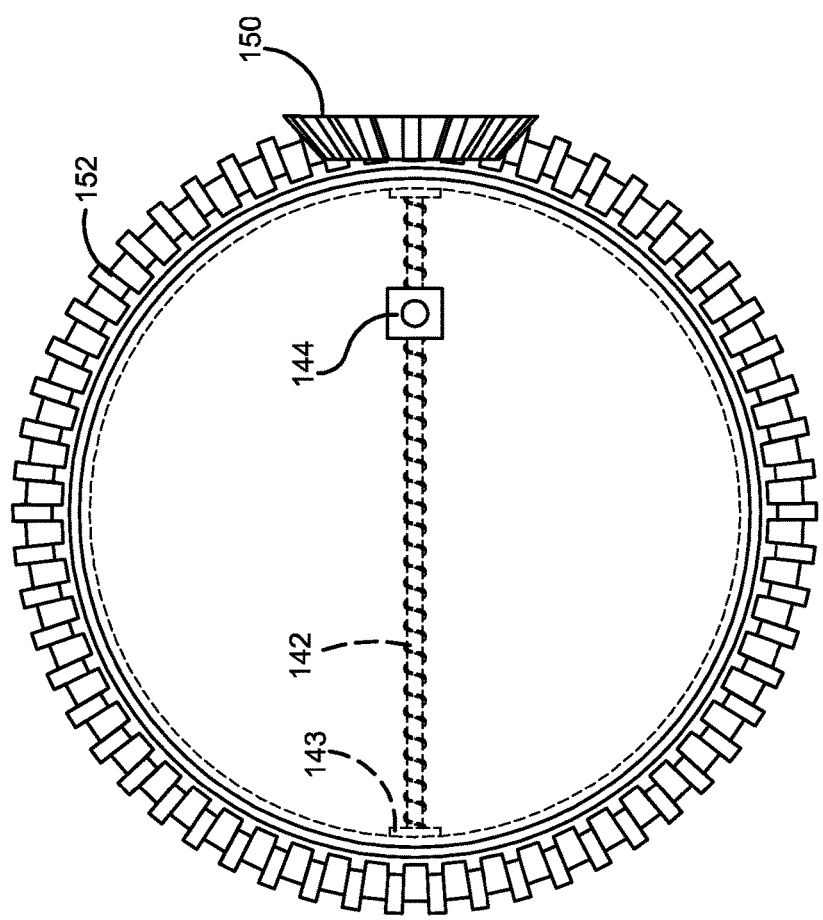
FIG. 12B is a top plan view of the stage drive assembly of the second embodiment of the XY translation stage.

A second embodiment of an XY translation stage is show in FIGS. 12A and 12B and designated by the numeral 120, and like parts to those in the embodiment of translation stage 20 receive like numerals, though increased by 100. To efficiently cover this embodiment, only the distinctions between it and the embodiment of translation stage 20 are covered in detail, and reference can be made to the first embodiment of translation stage 20 to appreciate the structure and functioning of those elements numbered in the drawings but not specifically described.

The translation stage 120 provides components that cause a continuous movement of the stage pin 146 during rotation of the stage drive assembly 138 by the primary drive mechanism 136. The lead screw 142 is mounted to the stage drive assembly 138 at bearings and bearing housings 143, much like the embodiment of translation stage 20, but one end of the lead screw extends through the bearing mounting to present a bevel gear 150. A mating bevel gear 152 is mounted to a stationary surface, as shown at legs 154. As the stage drive assembly 138 is rotated by the primary drive mechanism 136, the bevel gear 150 is rotated against the stationary mating bevel gear 152, with the result that the lead screw 142 is rotated and the ball nut 144 is moved along the lead screw 142 in proportion to the relative gearing ratio between the bevel gear 150 and the mating bevel gear 152. This in turn results in movement of the object stage 122, and as the stage drive assembly 138 continues to be rotated, a spiral movement pattern is produced.

Figure 13B:
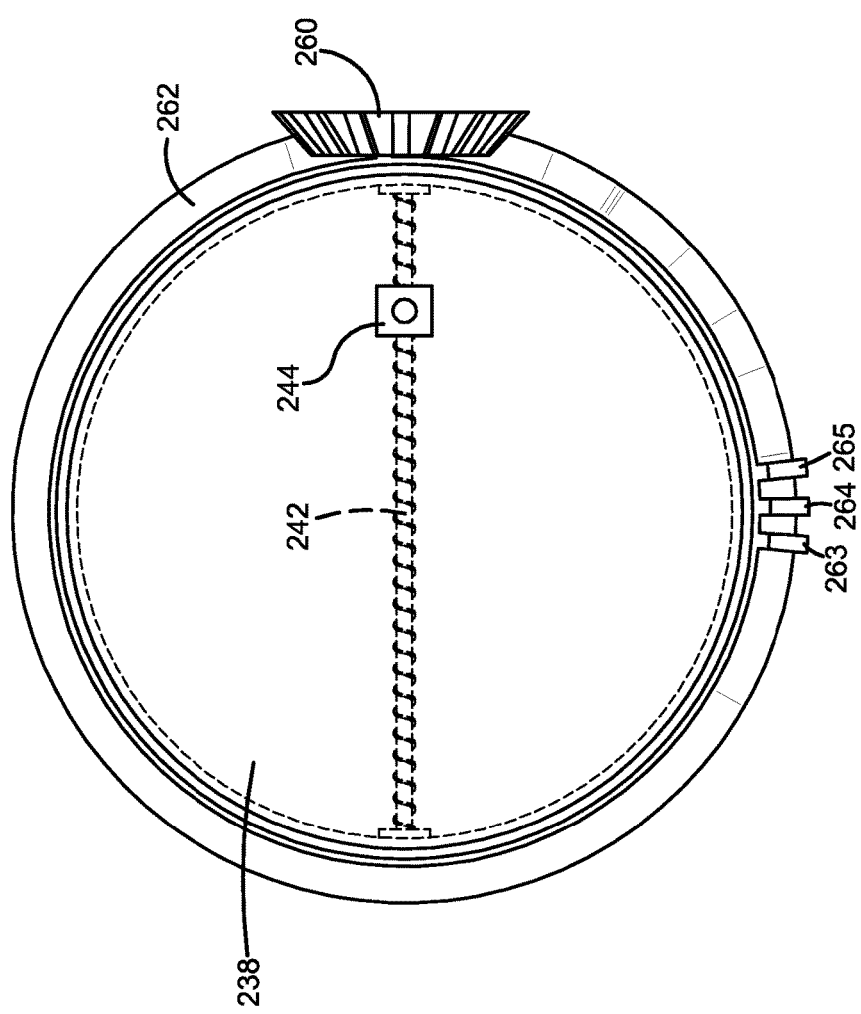
FIG. 13B is a top plan view of the stage drive assembly of the third embodiment of the XY translation stage.

A third embodiment of an XY translation stage is show in FIGS. 13A and 13B and designated by the numeral 220, and like parts to those in the embodiment of translation stage 20 receive like numerals, though increased by 200. To efficiently cover this embodiment, only the distinctions between it and the embodiments of translation stage 20 and translation stage 120 are covered in detail, and reference can be made to the first and second embodiments of translation stage 20 and 120 to appreciate the structure and functioning of those elements numbered in the drawings but not specifically described.

The translation stage 220 provides components that cause a discrete movement of the stage pin 246 during rotation of the stage drive assembly 238 by the primary drive mechanism 236. The lead screw 242 is mounted to the stage drive assembly 238 at bearings and bearing housings 243, much like the embodiment of translation stage 20, but one end of the lead screw extends through the bearing mounting to present a bevel gear 260. A mating bevel gear 262 is mounted to a stationary surface, as shown at legs 254; however, as compared to the bevel gear 152 of the second embodiment, which produces a spiral movement, this bevel gear 262 is modified such that only a limited number of gear cogs are present. These gear cogs are designated by the numerals 263, 264 and 265. It will be appreciated that, as the stage drive assembly 238 is rotated by the primary drive mechanism 236, the bevel gear 260 will be rotated by the stationary mating bevel gear 262 only when the bevel gear 260 engages and passes over the gear cogs 263, 264 and 265, with the result that the lead screw 242 is only rotated a discrete distance and the ball nut 244 is similarly moved only a discrete distance along the lead screw 242. This in turn results in a discrete movement of the object stage 222, and, with the structure shown for mating bevel gear 262, having only one discrete positioning of gear cogs, as the stage drive assembly 138 continues to be rotated, a movement pattern is produced that causes the object stage to move through discrete concentric circles.

The discrete movement of the ball nut 244 and hence the object stage 222 will depend upon the placement and number of the gear cogs on the mating beveled gear 262. For example, rotation of the bevel gear 260 over a single cog provided in the mating bevel gear 262 would result in a well-defined discrete movement. Continuing this example, if bevel gear 260 has 36 cogs, movement of the bevel gear 260 over a single cog on mating bevel gear 262 would rotate the bevel gear 260 and its attached lead screw 242 $\frac{1}{36}$ of a turn (10 degrees of rotation). If the mating bevel gear 262 has multiple cogs, as shown at 263, 264 and 265 the resulting rotation of the lead screw would be 3 times $\frac{1}{36}$ of a turn or 30 degrees. The lead screw 242 is rotated in proportion to the number of teeth on bevel gear 260 and the number of teeth on mating bevel gear 262 and the object stage 22 is moved respectively though the movement of the ball nut 244, coupling 248 and stage pin 246. Each rotation of the stage drive assembly 238 will move the object stage 222 one step so that a circular pattern is made on each rotation. Each successive rotation will move the platform to successively greater diameters up to the limit permitted by the end of the lead screw 242.

In light of the foregoing, it should thus be evident that the process of the present invention, providing a single primary drive mechanism, continuously scanning XY translation state, substantially improves the art. While, in accordance with the patent statutes, only the preferred embodiments of the present invention have been described in detail hereinabove, the present invention is not to be limited thereto or thereby. Rather the scope of the invention shall include all modifications and variations that fall within the scope of the attached claims.

The invention claimed is:

1. An XY translation stage comprising:
   a primary drive mechanism;
   a stage drive assembly, said primary drive mechanism rotating said stage drive assembly about an axis of rotation;
   an object stage that orbits freely in a defined plane without rotation of said object stage out of said plane;
   a stage pin associating said stage drive assembly with said object stage such that rotational movement of said stage drive assembly yields orbital movement of said object stage within said defined plane, wherein the positioning of said stage pin relative to said axis of rotation is adjustable such that the diameter of the orbital movement of said object stage is adjustable; and
   a lead screw associated with said stage drive assembly to rotate therewith, said stage pin being threaded onto said lead screw such that rotation of said lead screw causes said stage pin to move along the length of said lead screw to occupy different positions relative to said axis of rotation of said stage drive assembly, wherein said lead screw extends over said axis of rotation, and said stage pin is positionable along said lead screw at all points from said axis of rotation to the ends of the lead screw.

2. The XY translation stage of claim 1, further comprising:
   an object stage through bore in said object stage;
   a stage rod extending through said object stage through bore in a first direction and including a stage rod through bore; and
   a guide rod extending through said stage rod through bore, said stage rod, said guide rod, said object stage through bore and said stage rod through bore serving to limit movement of said object stage such that said object stage orbits freely in a defined plane without rotation of said object stage out of said plane.

3. An XY translation stage comprising;
   a primary drive mechanism;
   a stage drive assembly, said primary drive mechanism rotating said stage drive assembly about an axis of rotation;
   an object stage that orbits freely in a defined plane without rotation of said object stage out of said plane;
   a stage pin associating said stage drive assembly with said object stage such that rotational movement of said stage drive assembly yields orbital movement of said object stage within said defined plane, wherein the positioning of said stage pin relative to said axis of rotation is adjustable such that the diameter of the orbital movement of said object stage is adjustable;
   a lead screw associated with said stage drive assembly to rotate therewith, said stage pin being threaded onto said lead screw such that rotation of said lead screw causes said stage pin to move along the length of said lead screw to occupy different positions relative to said axis of rotation of said stage drive assembly, wherein said lead screw extends over said axis of rotation, and said stage pin is positionable along said lead screw at all points from the axis of rotation to the ends of the lead screw;
   a lead screw bevel gear associated with said lead screw; and
   a drive bevel gear that mates with said lead screw bevel gear, the lead screw bevel gear and drive bevel gear configured to interact during rotation of said lead screw, when said lead screw rotates with said stage drive assembly, the interaction of said lead screw bevel gear and said drive bevel gear serving to rotate said lead screw and thereby cause said stage pin to move along the length of said lead screw.

4. The XY translation stage of claim 3, wherein said drive bevel gear is stationary and includes a discrete set of bevel gear cogs, said lead screw bevel gear interacting with said drive bevel gear, through said discrete set of bevel gear cogs, once during a single rotation of said stage drive assembly and said stage pin moves a discrete distance due to said interaction.

5. The XY translation stage of claim 3, wherein said drive bevel gear is stationary and provides a complete ring of bevel gear cogs such that said lead screw bevel gear interacts with said drive bevel gear, through said bevel gear cogs, at all times during rotation of said stage drive assembly and said stage pin moves continuously along the length of said lead screw due to said interaction.

* * * * *